United States Patent
Williams et al.

(10) Patent No.: US 6,782,479 B1
(45) Date of Patent: Aug. 24, 2004

(54) APPARATUS AND METHOD FOR INHIBITING ANALYSIS OF A SECURE CIRCUIT

(75) Inventors: Ronald L. Williams, San Marcos, CA (US); Alan G. Thiele, San Diego, CA (US)

(73) Assignee: Raytheon Company, Waltham, MA (US)

( * ) Notice: Subject to any disclaimer, the term of this patent is extended or adjusted under 35 U.S.C. 154(b) by 1826 days.

(21) Appl. No.: 07/691,761

(22) Filed: Apr. 26, 1991

(51) Int. Cl.[7] ............................ G06F 12/14; H04L 9/32
(52) U.S. Cl. ........................ 713/194; 713/189; 713/193; 713/200; 380/52
(58) Field of Search .................. 380/2–5, 52; 361/172; 307/202.1; 713/189–202

(56) References Cited

U.S. PATENT DOCUMENTS

| 4,593,384 | A | * | 6/1986 | Kleijne ...................... 380/4 X |
| 4,691,350 | A | * | 9/1987 | Kleijne et al. ................. 380/3 |
| 4,755,815 | A | * | 7/1988 | Savoyet et al. ......... 361/172 X |
| 4,783,801 | A | * | 11/1988 | Kaule ............................. 380/3 |
| 4,860,351 | A | * | 8/1989 | Weingart ....................... 380/3 |
| 4,982,371 | A | | 1/1991 | Bolan ......................... 365/228 |
| 5,027,397 | A | * | 6/1991 | Double et al. ................. 380/4 |

* cited by examiner

*Primary Examiner*—Bernarr E. Gregory
(74) *Attorney, Agent, or Firm*—William C. Schubert

(57) ABSTRACT

A secure circuit is protected from reverse engineering by sensing radiation to which the circuit is normally not exposed, but which is present in its analysis. The circuit is modified in response to such radiation so that it is not compromised by subsequent analysis. The secure circuit can be implemented as a volatile memory having a power supply circuit that is interrupted in response to radiation exposure. Alternately, a circuit used to burn out the secure circuit, or to reprogram the circuit in the case of a programmable memory, could be actuated by the radiation exposure. Reprogramming mechanisms include an operational amplifier with its input state controlled by a photodiode, a random access memory cell with inherently photosensitive transistors, and a photosensitive transistor switch connecting a multi-vibrator to a memory address line.

23 Claims, 2 Drawing Sheets

APPARATUS AND METHOD FOR INHIBITING ANALYSIS OF A SECURE CIRCUIT

BACKGROUND OF THE INVENTION

1. Field of the Invention

This invention relates to methods and apparatus for protecting electrical circuitry from reverse engineering, and more particularly to the protection of codes stored in a memory circuit.

2. Description of the Related Art

It is very important to prevent unauthorized access to certain portions of electrical circuits, particularly integrated circuits. For example, digital codes or other data may be stored in certain portions of the circuit to prevent its unauthorized use; the circuit will function properly only if the user enters the appropriate code. Such circuitry may be compromised, however, by various methods of analysis, such as visual inspection, microprobing, x-ray, secondary electron emission voltage-contrast analysis, etc. A number of techniques have been used in the past to prevent such reverse engineering.

Perhaps the most basic technique is to enclose the circuit in a plastic encapsulation or protective die coating. However, access to the circuitry can still be gained by mechanical or acid drilling through the encapsulation material, or by sawing through the encapsulation. Another approach is to add misleading circuit topology so as to disguise the portion of the circuitry to be protected, or to customize each different die with its own specific code. An example of this approach is disclosed in U.S. Pat. No. 4,766,516, "Method and Apparatus for Securing Integrated Circuits from Unauthorized Copying and Use," Aug. 23, 1988, to Ozdemir et al. and assigned to Hughes Aircraft Company. These techniques may retard, but generally do not totally prevent, successful reverse engineering.

SUMMARY OF THE INVENTION

The present invention seeks to provide a protection system and method that is more reliable than prior techniques for preventing the reverse engineering of secure circuitry, and which operates automatically if the circuit package is tampered with.

The new protection technique provides a mechanism for modifying the secure circuit in case reverse engineering is attempted, so that the original circuit to which access is sought is no longer available. An actuating device for the modification function is provided that responds to radiation of the type used in a reverse engineering analysis, but to which the secure circuit is normally not exposed. When a reverse circuit analysis is attempted, the actuating mechanism senses the radiation and triggers the modification system to alter the secure circuitry.

When the secured circuit is volatile and is maintained by a power supply circuit, the modification system can be used to interrupt the power supply circuit. The interruption may be accomplished by means of a bipolar transistor switch, with a radiation responsive bias circuit for the switch. Other modification techniques include applying an overcurrent to the secure circuit to destroy its functionality, or reprogramming a secure programmable memory.

One actuating mechanism that can be used is an operational amplifier having a pair of differential inputs that are controlled by a radiation responsive element such as a photodiode. To reprogram a secure programmable memory circuit, the actuator may consist of a random access memory (RAM) cell formed from photosensitive transistors. The output from the RAM cell is connected to the secure memory's address line for reprogramming upon exposure to the radiation. Reprogramming can also be accomplished by an operational amplifier with a radiation responsive input, and an output circuit connected to reprogram the secure memory. A multivibrator connected to the secure memory's address line through a radiation responsive switch is another reprogramming option.

The protection system can be made responsive to virtually any type of radiation for which a sensitive element is available. This includes optical radiation (both visible and infrared), x-rays, and an electron beam (which may be considered as a form of radiation) from a scanning electron microscope.

These and other features and advantages of the invention will be apparent to those skilled in the art from the following detailed description, taken together with the accompanying drawings, in which:

DETAILED DESCRIPTION OF THE INVENTION

It is generally necessary to expose a secure circuit to radiation in an attempt to reverse engineer the circuit. For example, integrated circuit (IC) chips are typically encapsulated in plastic or a metal "can", and are often mounted on a board within a sealed case. Access to the circuit must be gained to reverse engineer it. Such access is typically obtained by sawing through the encapsulation, or using mechanical or acid drilling to access the chip's surface. Subsequent mechanical or scanning electron microscope (SEM) probing is then used to read out the secret code, in the case of a secure code stored in memory. X-ray analysis can also be performed in an attempt to determine the circuit's topography. Whatever technique is used to expose the chip's surface, the circuitry will normally be exposed to optical or other radiation during or as a result of the process.

Figure 1:
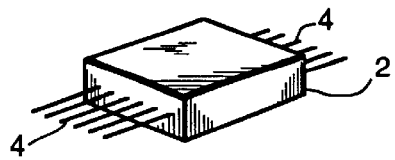
FIG. 1 is a perspective view of an encapsulated integrated circuit chip of the type that can be protected by the present invention.

A typical encapsulated IC is illustrated in FIG. 1. The chip is housed within a plastic/epoxy encapsulation 2, with lead wires 4 extending out of the encapsulation from the chip's contact pads.

Figure 2:
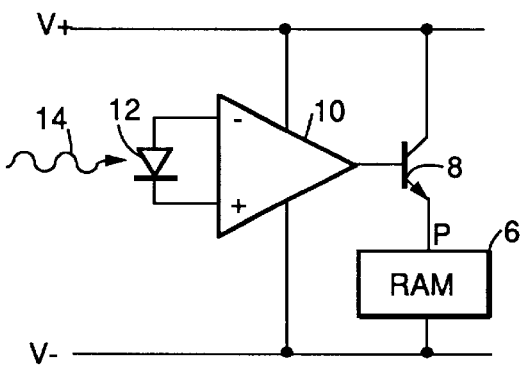
FIG. 2 is a circuit diagram of one embodiment in which the power supply for a secure volatile circuit is interrupted in response to radiation used in a reverse engineering attempt.

A first embodiment of the invention is illustrated in FIG. 2. A circuit 6 to be secured is included on a circuit chip that is encapsulated as shown in FIG. 1, or is otherwise protected from radiation normally used in a reverse engineering operation. The secure circuit 6 is preferably implemented as a programmable volatile digital memory, such as a static or dynamic RAM (random access memory). Dynamic RAM cells use a transistor and capacitor combination, with the digital information represented by a charge stored on each of the capacitors in the memory array. A static RAM, on the other hand, uses a series of transistors to form a flip-flop for each cell in the array. Both types of memory are considered to be "volatile" in the sense that they must be constantly maintained to retain their memory codes. The maintenance function is performed by a power supply circuit. If a dynamic RAM is not replenished from the power supply on a regular basis (typically every 2 ms), the capacitors will lose their charge and the code will be altered. If power is removed from a static memory, the flip-flop will reset and the memory will display a different code when power is restored. The secure circuit 6 will generally be part of a larger overall circuit (not shown) fabricated on the chip.

The RAM 6 is connected in a power supply circuit between positive and negative voltage busses V+ and V+ via a switch 8 that interrupts the power supply circuit when it is opened. Switch 8 may be implemented as a bipolar transistor, as indicated in the drawing.

The operation of transistor switch 8 is controlled by an actuator circuit that is connected to provide a control signal to the transistor base. The actuator circuit is preferably implemented by an operational amplifier 10 that is connected to the power supply lines so as to provide a normally "on" signal to the base of switch transistor 8. A radiation sensitive switch, such as a PIN photodiode 12, is connected between the amplifier's inverting and non-inverting input terminals. The photodiode 12 is preferably fabricated on the chip in relatively close proximity to the RAM 6. When the chip is exposed to radiation 14 in the course of a reverse engineering attempt, such as by opening the chip encapsulation so that optical radiation strike the chip's surface, the photodiode 12 injects electrons into the operational amplifier's non-inverting input. This drives the amplifier's non-inverting input to a negative level relative to its inverting input, causing the amplifier's output to similarly be negative or at most zero. As a result, the gating signal is removed from switch transistor 8 and the transistor effectively produces an open circuit between the power supply port P of RAM 6 and the positive voltage line V+, thus interrupting the power supply maintenance circuit for the RAM. The volatile RAM circuit accordingly loses the secure code with which it was originally programmed, so that the reverse engineering attempt will yield the wrong code.

At all other times, the diode 12 is shaded from the optical radiation by the chip encapsulation, and thus functions in a normal diode function to assure that the voltage at the operational amplifier's inverting input does not appreciably exceed its non-inverting input voltage. The bias applied to the power supply circuitry causes the amplifier to produce a positive output that holds transistor switch 8 closed, thus maintains the power supply for RAM 6.

Figure 3:
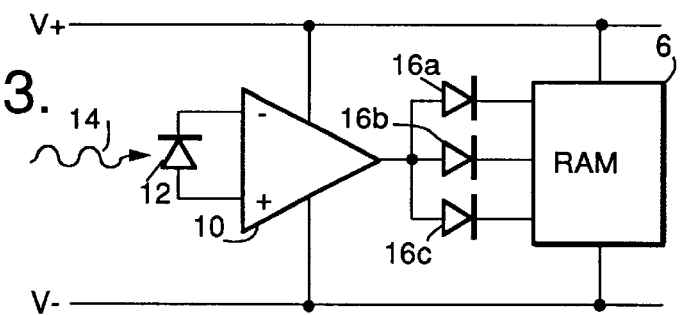
FIG. 3 is a circuit diagram of a radiation responsive mechanism for reprogramming or burning out a volatile memory in response to sensed radiation.

FIG. 3 shows another embodiment of the invention. This approach also uses a programmable memory such as RAM 6, and an operational amplifier 10 with a photodiode 12 connected in its input circuit. In this case, however, the power supply is biased so that operational amplifier 10 is normally off. The output of amplifier 10 is connected through a number of diodes 16a, 16b, 16c to respective address terminals of RAM 6. When the chip's surface is exposed to radiation 14, diode 12 injects electrons into the operational amplifier's inverting input, driving it negative relative to the non-inverting input. A positive output is thus produced from the operational amplifier 10 that resets the RAM, erasing the secure code. If the amplifier 10 is a high power device, this arrangement can be used to overheat and burn out the memory (which in this case can alternately be a read only memory), thus destroying the memory circuit's ability to hold any secure code.

The circuits of FIGS. 2 and 3 require that the power supply be biased properly to set the operational amplifier either normally "on" or normally "off", respectively. However, this bias is subject to voltage spikes on the power supply line that can erase the memory. Either a very good filter should be used for the power supply line, or an alternate actuating mechanism that is not so vulnerable to power supply voltage spikes should be substituted.

Figure 4A:
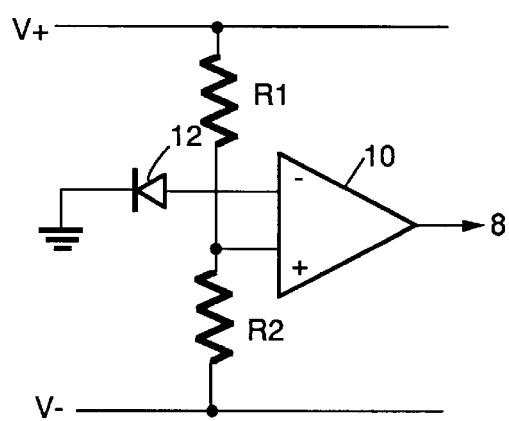
FIGS. 4a and 4b are circuit diagrams of alternate actuating mechanisms for the embodiments of FIGS. 2 and 3, respectively.
Figure 4B:
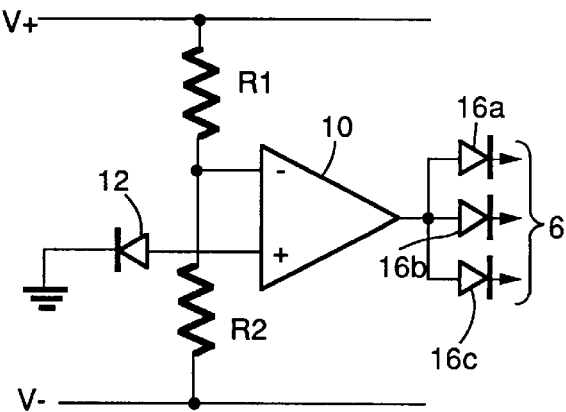

Examples of suitable alternate actuating circuits are given in FIGS. 4a and 4b, which are used to hold the operational amplifier 10 normally "on" and normally "off", respectively. In FIG. 4a, the non-inverting input to the operational amplifier is tapped from a voltage divider circuit consisting of resistors R1 and R2 connected in series between V+ and V−. The resistor values are selected so that the non-inverting amplifier input is held at a voltage just slightly greater than zero (for example, on the order of + 0.01 volt). The photodiode 12 is connected to normally keep the amplifier's inverting input from rising above ground potential, so that the amplified output to transistor switch 8 is positive and normally holds the switch closed.

When photodiode 12 is exposed to light, it draws electrons from the amplifier's inverting input, sending the inverting input positive. This causes the amplifier's output to go negative, turning off the transistor switch 8.

This arrangement is reversed in FIG. 4b, in which the voltage divider circuit R1–R2 holds the amplifier's inverting input slightly positive, and the non-inverting input is normally held at ground potential or less by photodiode 12. When exposed to light, photodiode 12 sends the amplifier's non-inverting input positive, causing the amplifier output to go positive and either reprogram or burn out RAM 6.

Figure 5:
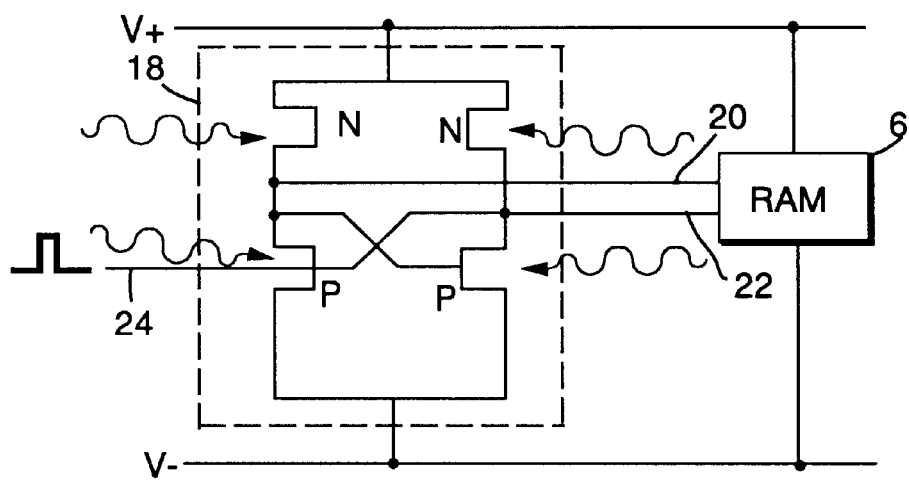
FIG. 5 is a circuit diagram showing another radiation responsive mechanism for reprogramming a volatile secure memory.

Another approach to reprogramming a secure memory circuit in response to radiation exposure is shown in FIG. 5. In this circuit a radiation sensitive RAM cell 18 is used to reprogram RAM 6. Cell 18 can either be separate from, or integrated into, RAM 6. Its circuit design is conventional, utilizing CMOS (complementary metal oxide semiconductor) devices. It consists of two branches, with each branch having series connected n-channel and p-channel transistors, and the gates and drains of the p-channel devices in the two branches cross-coupled. Output lines 20 and 22 are taken from the electrical mid-points of the two branches, and connected to respective address ports of RAM 6.

Transistors such as those used in RAM cell 18 are inherently optically sensitive. When the cell is exposed to optical radiation, the outputs to RAM 6 will change in a random, unpredictable fashion to reset-reprogram RAM 6. The output pattern supplied by the cell 18 will depend upon which of its transistors is illuminated first, and the states of the various transistors immediately prior to illumination. Alternately, one of the cell transistors could be made larger than the others so that it is more light sensitive, and accordingly always changes state when illuminated. An initializing line 24 is preferably connected to one of the p-channel transistors in the cell 18 so that the normal transistor states without illumination can be controlled.

Figure 6:
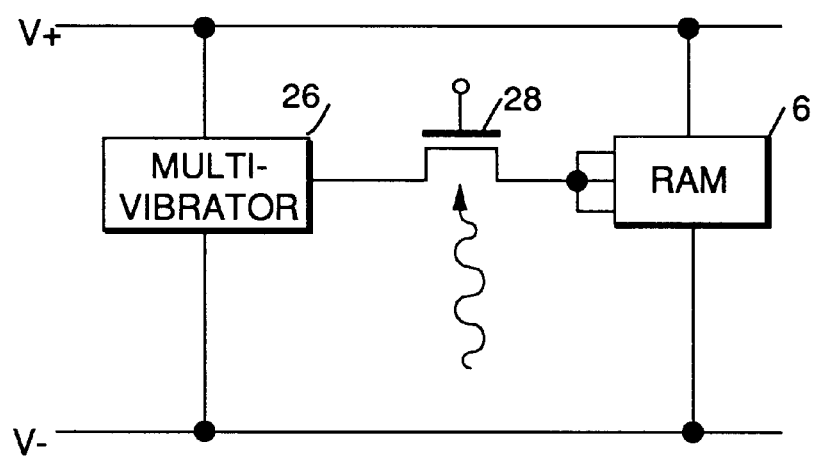
FIG. 6 is a block diagram of another scheme for reprogramming a secure memory circuit.

Another variation that reprograms the RAM 6 in response to radiation exposure is illustrated in FIG. 6. The output of a multivibrator 26 is connected to one or more of the RAM address lines through the source-drain circuit of a field effect transistor (FET) 28; the FET's gate is allowed to float. FETs have a fairly high optical sensitivity, so that FET 28 becomes conductive when the chip package is opened and its interior exposed to light. This allows the multivibrator output to be connected directly to the address lines of RAM 6, causing the RAM to be continuously cycled for as long as FET 28 is illuminated. The secure code will thus be unavailable for reverse engineering.

While the invention has been illustrated with circuitry that is sensitive to optical radiation, it can also be implemented with circuit devices that are sensitive to x-rays or any other portion of the electromagnetic spectrum that might be utilized in a reverse analysis, limited only by the availability of devices that are sensitive to radiation at any particular wavelength. An electron beam from a scanning electron microscope may also be considered to be a form of radiation for this purpose. While scanning electron microscopes operate at a fairly low energy level and their beams are difficult to detect, suitable sensitive circuit devices may become available that can be used to disable a secure portion of the circuit in response to a scanning electron beam, in a manner analogous to the photodiodes or FETs described herein.

While particular embodiments of the invention have been shown and described, numerous variations and alternate embodiments will occur to those skilled in the art. Accordingly, it is intended that the invention be limited only in terms of the appended claims.

We claim:

1. A protection system for inhibiting analysis of a secure circuit having a memory, said secure circuit located on an integrated circuit chip within encapsulation, comprising:

modifying means, located on said integrated circuit chip, for modifying said secure circuit to inhibit successful analysis of said secure circuit, said modifying means comprising at least one of the following: a means for reprogramming said memory and a means for destroying the functionality of said secure circuit, and an actuation means, located on said integrated circuit chip, for actuating said modifying means to modify the secure circuit, said actuation means being responsive to radiation that is present in said analysis, but to which radiation the secure circuit is normally not exposed while the integrated circuit chip is within said encapsulation.

2. The protection system of claim 1, said secure circuit comprising a volatile circuit that is maintained by a power supply circuit, said modifying means comprising means for interrupting said power supply circuit so that said memory is reprogrammed.

3. The protection system of claim 2, said modifying means comprising an interrupt switch in said power supply circuit, said actuation means comprising an actuator for said switch.

4. The protection system of claim 3, said switch comprising a bipolar transistor, and said actuation means comprising a bias circuit for said transistor that responds to said radiation by altering the switching state of said transistor between an "on" and an "off" state.

5. The protection system of claim 1, said actuation means comprising an operational amplifier having an output connected to control said modifying means, and a pair of differential inputs that are coupled by an element that is responsive to said radiation.

6. The protection system of claim 5, said radiation responsive element comprising a photodiode.

7. The protection system of claim 1, said modifying means comprising means for destroying the functionality of said secure circuit by overheating said secure circuit.

8. The protection system of claim 7, said means for destroying comprising means for applying a current to said secure circuit in excess of its current handling capacity.

9. The protection system of claim 1, said secure circuit comprising a programmable memory programmed with a predetermined code, and said modifying means comprising means for reprogramming said memory.

10. The protection system of claim 9, said programmable memory having a program address line, said means for reprogramming comprising circuit means for applying a reprogram signal to said address line.

11. The protection system of claim 10, wherein said circuit means comprises an operational amplifier having an output connected to said address line and a pair of differential inputs such that said operational amplifier applies said reprogram signal to said address line in the presence of a first pair of signals on said inputs, and wherein said actuation means comprises a radiation responsive element having an output connected to at least one of said inputs, whereby when said element is exposed to said radiation, said first pair of signals on said inputs is present.

12. The protection system of claim 10, said actuation means comprising a random access memory (RAM) cell formed from a plurality of photosensitive transistors, and said circuit means connecting the output of said RAM cell to the programmable memory's address line.

13. The protection system of claim 10, said circuit means comprising a multivibrator, and said actuation means comprising an interrupt switch normally disconnecting the multivibrator's output from said program address line, said interrupt switch responding to exposure to said radiation to apply the multivibrator's output to said program address line so that said programmable memory is cycled by said multivibrator during said exposure.

14. The protection system of claim 13, said interrupt switch comprising a field effect transistor.

15. The protection system of claim 1, wherein said actuation means is responsive to optical radiation.

16. The protection system of claim 1, wherein said actuation means is responsive to x-ray radiation.

17. The protection system of claim 1, wherein said actuation means is responsive to an electron beam.

18. A protection system for inhibiting analysis of a secure circuit having a programmable memory with a predetermined code, comprising:

a program address line for said memory;

circuit means for applying a reprogram signal to said address line to inhibit successful analysis of said secure circuit; and an actuation means for actuating said circuit means, said actuation means being responsive to radiation that is present in said analysis, but to which radiation the secure circuit is in the absence of said analysis not normally exposed.

19. The protection system of claim 18, wherein said circuit means comprises an operational amplifier having an output connected to said address line and a pair of differential inputs such that said operational amplifier applies said reprogram signal to said address line in the presence of a first pair of signals on said inputs, and wherein said actuation means comprises a radiation responsive element having an output connected to at least one of said inputs, whereby when said element is exposed to said radiation, said first pair of signals on said inputs is present.

20. The protection system of claim 18, said actuation means comprising a random access memory (RAM) cell formed from a plurality of photosensitive transistors and said circuit means comprising means for connecting the output of said RAM cell to the memory's address line.

21. The protection system of claim 18, said circuit means comprising a multivibrator, and said actuation means comprising an interrupt switch normally disconnecting the multivibrator's output from said program address line, said interrupt switch responding to exposure to said radiation to apply the multivibrator's output to said program address line so that said memory is cycled by said multivibrator during said exposure.

22. The protection system of claim 21, said interrupt switch comprising a field effect transistor.

23. A protection system for inhibiting analysis of a secure circuit comprising a volatile circuit that is maintained by a power supply circuit, comprising:

an interrupt switch comprising a bipolar transistor for interrupting said power supply circuit when said bipolar transistor is subjected to a bias, and a bias circuit for said transistor, said bias circuit responsive to radiation present in said analysis that is not present during the normal use of said secure circuit to subject said transistor to said bias, whereby said power supply circuit is interrupted.

\* \* \* \* \*